(12) United States Patent  
Ishida et al.

(10) Patent No.: US 6,177,731 B1  
(45) Date of Patent: Jan. 23, 2001

(54) SEMICONDUCTOR PACKAGE

(75) Inventors: Yoshihiro Ishida, Tanashi; Taichi Miyazaki, Tokorozawa; Atsushi Omura, Tokorozawa; Tsutomu Ohara, Tokorozawa; Shuichi Ishiwata, Tanashi, all of (JP)

(73) Assignee: Citizen Watch Co., Ltd., Tokyo (JP)

( * ) Notice: Under 35 U.S.C. 154(b), the term of this patent shall be extended for 0 days.

(21) Appl. No.: 09/380,243

(22) PCT Filed: Jan. 19, 1999

(86) PCT No.: PCT/JP99/00140

§ 371 Date: Aug. 30, 1999

§ 102(e) Date: Aug. 30, 1999

(87) PCT Pub. No.: WO99/36957

PCT Pub. Date: Jul. 22, 1999

(30) Foreign Application Priority Data

Jan. 19, 1998 (JP) .................................. 10-007472

(51) Int. Cl.[7] .......................... H01L 23/48; H01L 23/52; H01L 29/40
(52) U.S. Cl. .......................... 257/780; 257/783; 257/772
(58) Field of Search .................................. 257/782, 783, 257/780, 781, 779, 778, 772

(56) References Cited

U.S. PATENT DOCUMENTS

| 5,229,646 | * | 7/1993 | Tsumura . |
|---|---|---|---|
| 5,869,904 | * | 2/1999 | Shoji . |
| 5,886,409 | * | 3/1999 | Ishino et al. . |
| 5,892,288 | * | 4/1999 | Muraki et al. . |
| 5,905,303 | * | 5/1999 | Kata et al. . |
| 5,925,931 | * | 7/1999 | Yamamoto . |
| 5,925,936 | * | 7/1999 | Yamaji . |
| 5,936,304 | * | 8/1999 | Lii et al. . |
| 6,008,543 | * | 12/1999 | Iwabuchi . |
| 6,034,437 | * | 3/2000 | Shibata . |
| 6,057,598 | * | 5/2000 | Payne et al. . |
| 6,091,141 | * | 7/2000 | Heo . |
| 6,097,050 | * | 8/2000 | Hartner et al. . |

FOREIGN PATENT DOCUMENTS

| 1-199439 | 8/1989 | (JP) . |
|---|---|---|
| 9-167784 | 6/1997 | (JP) . |

* cited by examiner

Primary Examiner—Sheila V. Clark  
(74) Attorney, Agent, or Firm—Kanesaka & Takeuchi

(57) ABSTRACT

An organic resin film 27 having an opening on an electrode pad is formed on a main surface of an IC chip 10, and a protruding electrode 12 formed on the electrode pad is formed of a low melting point eutectic solder. As a result, the protruding electrode 12 is formed without melting the organic resin film while preventing a crack from being generated by a stress applied between the electrode pad and the IC chip. Thus, the reliability of a semiconductor package can be enhanced.

15 Claims, 7 Drawing Sheets

SEMICONDUCTOR PACKAGE

TECHNICAL FIELD

The present invention relates to a semiconductor package, and more particularly to a ball grid array (BGA) type semiconductor package comprising an organic circuit board and an IC chip mounted on the board by flip chip bonding.

BACKGROUND ART

Conventionally, a BGA type semiconductor package having a bear chip mounted on a board directly by face down technique, has been developed with a reduction in the size of a semiconductor package and an increase in the density thereof. For the bear chip mounting, a flip chip bonding technique has been utilized.

In recent years, furthermore, the market has really demanded a semiconductor package whose size is reduced still more so as to be mounted on a camera integral type VTR, a portable apparatus such as a pocket telephone (portable telephone) and the like. For this reason, a package obtained by making the size of a flip chip semiconductor package almost equal to that of the bear chip, that is, a so-called CSP (chip size/scale package) has rapidly been developed.

With reference to FIGS. 9 and 10, the structure of a BGA type semiconductor package in a general CSP according to the prior art will be described below. FIG. 9 is a sectional view showing a semiconductor package 1 according to the prior art. FIG. 10(A) is a top view showing an organic circuit board 13 constituting the semiconductor package 1 shown in FIG. 9, and FIG. 10(B) is a bottom view showing the organic circuit board 13.

The semiconductor package 1 shown in FIG. 9 is constituted by the organic circuit board 13 and an IC chip 10 mounted on the organic circuit board 13 by flip chip bonding.

A bonding pattern 15 for IC chip connection is formed on a first main surface side 13a of a base material 14 of the organic circuit board 13. The first main surface side 13a is covered with a resist film 16 having an opening on each bonding pattern 15. Furthermore, an external terminal pattern 17 is formed in a grid array on a second main surface side 13b. The second main surface side 13b is covered with a resist 22 having an opening on each external terminal pattern 17.

Most of conventional IC chips have been designed on condition that they are mounted by wire bonding. Therefore, an electrode pad 11 is provided in one line (peripheral position) or alternately in two lines along the outer peripheral portion of a main surface 10a of the IC chip 10.

By electrically connecting the electrode pad 11 to the bonding pattern 15 through a protruding electrode 12, the IC chip 10 is mounted on the organic circuit board 13 with face down by flip chip bonding. Furthermore, a gap between the IC chip 10 and the organic circuit board 13 is integrally sealed with a thermosetting sealing resin 23 by side potting.

A ball electrode 21 is formed on the external terminal pattern 17. The semiconductor package 1 is mounted on a mother board (not shown) via the ball electrode 21.

A protruding electrode 12 formed on the electrode pad 11 of the IC chip 10 repeats thermal expansion and contraction even time a heat treatment such as a reflow treatment is carried out during formation and flip chip mounting. The coefficient of thermal expansion of the protruding electrode 12 is different from that of the electrode pad 11. Therefore, a stress is applied to the electrode pad 11 and an IC chip portion provided therearound by the thermal expansion of the protruding electrode 12. As a result, a crack is generated between the electrode pad 11 and the IC chip 10 along the circumference of the electrode pad 11 in some cases. There is a possibility that the conduction of the electrode pad 11 and the IC chip 10 might become defective by the crack, thereby causing the IC chip to perform a malfunction. For this reason, there has been a problem in that the reliability of the semiconductor package is deteriorated by the generation of the crack.

The bonding pattern of the conventional organic circuit board 13 is usually arranged in a position corresponding to the position of the electrode pad 11 of the IC chip 10, that is, in a line along four sides of a quadrangle as shown in FIG. 10(A). On the other hand, the external terminal pattern 17 of the organic circuit board 13 is arranged in a grid array as shown in FIG. 10(B).

Furthermore, a through hole 18 is arranged in a line along the outer periphery of the organic circuit board 1 so as to surround the quadrangle obtained by the arrangement of the bonding pattern 15 as shown in FIG. 10(A). More specifically, the through hole 18 is arranged to surround a region where the external terminal pattern 17 is to be formed on the outside thereof as shown in FIG. 10(B).

A wiring pattern 19 for connecting each bonding pattern 15 and each through hole 18 one by one is formed on the first main surface side, and a wiring pattern 20 for connecting each external terminal pattern 17 and each through hole 18 one by one is formed on the second main surface side. Each bonding pattern 15 and each external terminal pattern 17 are electrically connected to each other via the through hole 18.

As shown in FIG. 10(B), the through hole 18 is provided on the outside of the region where the external terminal pattern 17 is to be formed. For this reason, it is necessary to provide a wiring 20a connected to another external connecting pattern between adjacent external terminal patterns 17a and 17b, for example. If the number of the external connecting patterns 17 is increased, the number of wirings is increased. If the number of the wirings between the external connecting patterns is increased, a space between the adjacent external connecting patterns should be enlarged. In the conventional semiconductor package, therefore, it has been hard to reduce the area of the organic circuit board to have a small size without decreasing the number of the external connecting patterns.

Accordingly, the present invention has been made in consideration of the above-mentioned problems and it is an object of the present invention to provide a BGA type flip chip bonded semiconductor package which is suitable for mounting on a small-sized portable apparatus or the like, has a small size and excellent reliability and is inexpensive.

DISCLOSURE OF THE INVENTION

The present invention provides a semiconductor package comprising an organic circuit board in which a bonding pattern for IC chip connection is formed on a first main surface side, an external terminal pattern is formed in a grid array on a second main surface side and a through hole for electrically connecting the bonding pattern and a ball electrode terminal is formed, and an IC chip which has an electrode pad formed on a main surface and is mounted by flip chip bonding on the organic circuit board through a protruding electrode formed on the electrode pad, a gap between the organic circuit board and the IC chip being filled with a sealing resin, and a ball electrode being formed on the external terminal pattern, wherein the main surface of the IC chip is covered with an organic resin film having an opening on the electrode pad, and the protruding electrode is formed of an eutectic solder having a lower melting temperature than a heat resisting temperature of the organic resin film.

According to the semiconductor package of the present invention, thus, the main surface provided around the electrode pad of the IC chip is covered with the organic resin film. Therefore, the stress applied to the IC chip portion around the electrode pad by the thermal expansion of the protruding electrode can be relieved. As a result, a crack can be prevented from being generated between the electrode pad and the IC chip. Accordingly, the reliability of the semiconductor package can be enhanced.

However, the organic resin film has a low heat resistance. For this reason, with the material such as a high melting point solder to be used in a conventional protruding electrode, the organic resin film is molten when the protruding electrode is heated for self-alignment mounting. Therefore, it is hard to self-alignment mount the IC chip on the organic circuit board.

On the other hand, in the case where non self-alignment mounting is to be carried out, it is necessary to align the protruding electrode of the IC chip with high precision with respect to the bonding pattern of the organic circuit board. In this case, therefore, an expensive bonding device is required so that the cost of the semiconductor package is increased.

According to the present invention, therefore, the organic resin film is formed and the protruding electrode is further formed of an eutectic solder having a lower melting temperature than the heat resisting temperature of the organic resin film. As a result, even if the protruding electrode is subjected to a reflow, the IC chip can be mounted on the organic circuit board without melting the organic resin film According to the present invention, therefore, it is possible to inexpensively provide a semiconductor package which suppresses the generation of a crack and has high reliability.

In the semiconductor package according to the present invention, it is preferable that the organic resin film should have a thickness of 1 $\mu$m to 10 $\mu$m.

Thus, if the thickness is 1 $\mu$m or more, the flatness of the surface of the organic resin film may be kept and the stress applied around the electrode pad by the thermal expansion of the protruding electrode may fully be relieved. If the thickness is 10 $\mu$m or less, the organic resin film may easily be formed by a spin coating method and an excessive increase in an aspect ratio of the opening formed on the electrode pad may be avoided.

In the semiconductor package according to the present invention, it is preferable that the organic resin film should be formed of a photosensitive polyimide resin.

Thus, if the organic resin film is formed of the photosensitive polyimide resin, the patterning process of the opening may be simplified more than in the case where a non-photosensitive resin is used.

According to the present invention, it is preferable that the organic resin film portion on the rewiring structure has a thickness of 1 $\mu$m to 3 $\mu$m.

Thus, if the thickness is 1 $\mu$m or more, the flatness of the surface of the organic resin film portion may be kept. If the thickness is 3 $\mu$m or less, it may be possible to prevent the edge portion of the opening from becoming a protrusion-shaped portion when patterning the opening formed on the electrode pad.

In the semiconductor package of the present invention, it is preferable that the eutectic solder constituting the protruding electrode should have a composition containing tin and lead at a weight ratio of 6:4.

If the composition of the eutectic solder has such a weight ratio, the melting temperature of the eutectic solder may fully be reduced down to about 230° C. or less.

According to the present invention, it is preferable that the gap between the IC chip and the circuit board should have a height of 50 $\mu$m to 150 $\mu$m.

If the height of the gap is 50 $\mu$m or more, the injection speed of the sealing resin is increased so that a time taken for resin sealing may be shortened. If the height of the gap is set to 150 $\mu$m or less, the height from the first main surface of the organic circuit board to the top face of the mounted IC chip may be prevented from being excessively increased.

In the semiconductor package according to the present invention, it is preferable that the protruding electrode should be constituted by a copper or nickel core layer and the eutectic solder formed on the core layer.

Both copper and nickel are metals to easily get wet with the solder. For this reason, if the copper or nickel core layer is provided, the shape of the eutectic solder may be prevented from being enlarged when the eutectic solder of the protruding electrode is subjected to a reflow. Consequently, a constant height of the protruding electrode or more may be kept after the reflow. As a result, the gap between the IC chip and the organic circuit board may have a constant height or more.

Tin which is the component of the eutectic solder is easily molten into the component of the electrode pad (for example, copper). Therefore, if the eutectic solder is formed directly on the electrode pad, tin atoms in the eutectic solder are diffused so that the adhesion to the electrode pad is deteriorated. Consequently, the protruding electrode is separated, thereby causing a disconnection.

According to the present invention, it is preferable that the core layer should have a thickness of 5 $\mu$m to 20 $\mu$m.

Thus, if the thickness of the core layer is 5 $\mu$m or more, metal atoms are diffused only between the eutectic solder and the core layer. Therefore, a deterioration in the adhesion of the electrode pad may be avoided. As a result, the generation of the disconnection may be suppressed and the reliability of the semiconductor package may be enhanced.

If the thickness of the core layer is 20 $\mu$m or less, an increase in the volume of the eutectic solder of each protruding electrode may be avoided. As a result, an excessive increase in the stress applied to the periphery of the electrode pad by the thermal expansion of the protruding electrode may be avoided.

According to the present invention, it is preferable that a pitch at which the protruding electrodes are arranged should range from 200 $\mu$m to 2000 $\mu$m.

Thus, if the pitch is 200 $\mu$m or more, there is no possibility that the bonding patterns arranged at the same pitch as the protruding electrodes might be short-circuited when the protruding electrode is subjected to a reflow and is mounted. As a result, the IC chip may easily be mounted on the organic circuit board in self-alignment. Thus, productivity may be enhanced.

If the pitch is 2000 $\mu$m or less, it is possible to avoid an excessive reduction in the number of the protruding electrodes provided on the main surface having the constant area of the IC chip.

In order to implement the self-alignment mounting, it is necessary to keep a constant space or more between the bonding patterns. For this reason, it is necessary to arrange the electrode pads on the main surface of the IC chip at a constant space or more. In order to provide a large number of electrode pads on the main surface of the IC chip while keeping a constant space, it is preferable that the electrode pads should not be arranged in the peripheral form but in a grid array.

However, a large number of IC chips are designed on condition that they are bonding chip mounted. For this reason, the electrode pads of the IC chip are mostly arranged in the peripheral form. On the other hand, if the IC having the electrode pads arranged in a grid array is newly designed, the price of the IC chip is increased.

In the semiconductor package according to the present invention, it is preferable that an electrode pad for wire bonding should be formed along an outer periphery of the main surface of the IC chip, the protruding electrodes should be arranged in a grid array in a region surrounded by the pad, and a rewiring structure should be provided in the organic resin film for electrically connecting the electrode pad and the protruding electrode for flip chip mounting.

Thus, if the rewiring structure is provided, the protruding electrodes may be provided in a grid array while suppressing an increase in the manufacturing cost by utilizing the IC chip for wire bonding which has electrode pads arranged in the peripheral form.

In the semiconductor package according to the present invention, it is preferable that the rewiring structure should be a two-layer structure having a chromium layer and an aluminum layer.

The chromium layer has excellent adhesion to the organic resin film, and the aluminum layer has high conductivity. Accordingly, these two layers are provided so that a rewiring structure having excellent adhesion and high conductivity may be obtained.

In the semiconductor package according to the present invention, it is preferable that at least a part of the through holes formed on the organic circuit board should be provided in positions shifted by a half grid from a position of a grid where the external terminal pattern is formed.

Thus, if the through holes are provided between the external terminal patterns, the area of the organic circuit board may be reduced without decreasing the number of the external terminal patterns as compared with the case where the through holes are arranged on the outside of the region where the external terminal patterns are to be formed. Moreover, the length of the wiring path between the external terminal pattern and the bonding pattern is reduced. Consequently, the electrical characteristics of the semiconductor package may be enhanced.

If the through holes are regularly formed in positions shifted from the external terminal pattern by a half grid, the board may easily be designed.

In the semiconductor package according to the present invention, it is preferable that an end on the first main surface side of the through hole should be covered with a solder resist film in a region sealed with the sealing resin of the organic circuit board.

Thus, if the entrance of the through hole of the sealing region is covered, the following various advantages may be obtained when sealing, with a resin, the gap between the flip chip mounted IC chip and the organic circuit board. More specifically, it is possible to avoid the flow of the sealing resin into the through hole. Therefore, the amount of the sealing resin to be injected may accurately be controlled.

Moreover, it is possible to prevent the sealing resin from flowing into the second main surface side via the through hole. Furthermore, it is also possible to prevent the air from entering the sealing resin via the through hole, thereby generating a void.

Since the entrance of the through hole is simply blocked, it is not necessary to perform a step of filling the through hole with a solid.

In the semiconductor package according to the present invention, it is preferable that the bonding pattern for IC chip connection should be provided in a position shifted from a portion positioned just above the through hole.

Thus, the bonding pattern is provided excluding the portion positioned just above the through hole, the protruding electrode and the bonding pattern may surely be connected electrically when the IC chip is to be mounted by flip chip bonding.

In the semiconductor package according to the present invention, it is preferable that the ball electrode should be formed of a material having the same component as the eutectic solder constituting the protruding electrode.

With such a structure, the ball electrode may be subjected to a reflow at a lower temperature than the heat resisting temperature of the organic resin film. As a result, the semiconductor package may be mounted on the mother board without melting the organic resin film.

Since the same material is used for the protruding electrode and the material of the solder ball, the cost of the material may be reduced.

When the ball electrode is to be subjected to the reflow, the protruding electrode is also molten by a heat treatment. However, since the protruding electrode is sealed with the sealing resin, there is no problem even if the protruding electrode is molten.

BEST MODE FOR CARRYING OUT THE INVENTION

Figure 1:
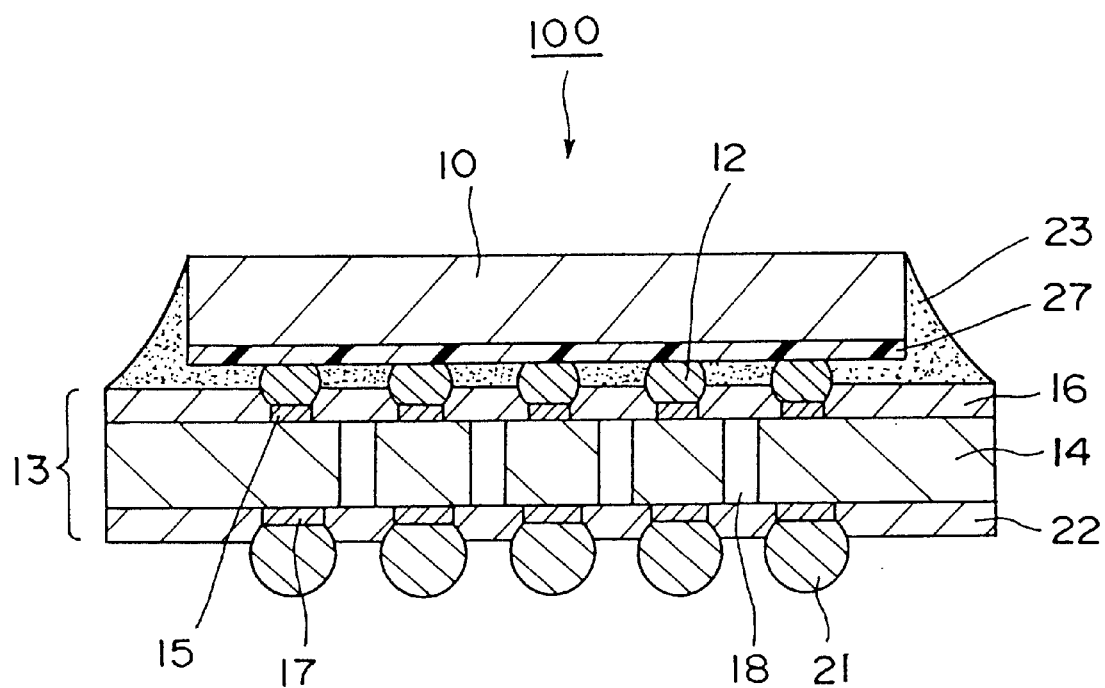
FIG. 1 is a sectional view showing a semiconductor package according to an embodiment of the present invention.

An embodiment of the present invention will be described below with reference to the drawings. The drawings are referred to schematically illustrate the size, shape and arrangement relationship of each component in such a manner that the present invention may be understood. Accordingly, the present invention is not restricted to only examples shown in the drawings.

With reference to FIG. 1, a semiconductor package according to the embodiment of the present invention will be described below. FIG. 1 is a sectional view showing a semiconductor package 100 according to the embodiment. The semiconductor package 100 comprises an organic circuit board 13 and an IC chip 10 mounted on the organic circuit board 13 by flip chip bonding.

Organic Resin Film

First of all, particularly, an organic resin film 27 of a structure on the IC chip 10 side will be described.

A main surface of the IC chip 10 is covered with an organic resin film 27 having a thickness of several $\mu$m. The organic resin film 27 has an opening on an electrode pad (which is not shown in FIG. 1). A protruding electrode 12 is formed on each electrode pad.

Thus, the organic resin film 27 is provided so that a stress applied to the IC chip portion around the electrode pad by the thermal expansion of the protruding electrode 12 can be relieved. As a result, a crack can be prevented from being generated between the electrode pad and the IC chip 10. Consequently, the reliability of the semiconductor package 100 can be enhanced. Furthermore, the organic resin film is provided so that flatness on the main surface side of the IC chip 10 can be enhanced, thereby preventing the generation of a void during resin sealing.

If the organic resin film has a thickness of about 1 $\mu$m or more, the stress can fully be relieved and the flatness can be ensured.

In the present embodiment, the organic resin film 27 is formed of a photosensitive polyimide resin. The polyimide resin film can be formed, by a spin coating method, on a wafer having an IC chip formed thereon. Therefore, a resin film having a uniform thickness can easily be formed. As such a photosensitive polyimide resin, for example, PIMEL (trade name) manufactured by Asahi Chemical Industry Co., Ltd. and PHOTONIESE (trade name) manufactured by Toray Industries, Inc. can be used.

The organic resin film having a thickness of 1 $\mu$m or less can easily be formed by the spin coating method, and an aspect ratio of the opening is not excessively increased.

Furthermore, the polyimide resin contributes to an enhancement in the reliability of the semiconductor package for the following three reasons. First of all, since the polyimide resin has high adhesion force to a passivation film acting as an inorganic film and a sealing resin, it can prevent the flaking of the IC chip. Secondly, since the polyimide resin has high insulation, a leakage current can be prevented from being generated between the protruding electrodes. Thirdly, the polyimide resin has a sufficient heat resistance in the ordinary use environment of the semiconductor package.

Furthermore, the polyimide resin to be used in the present embodiment has photosensitivity. Therefore, a pattern forming process can be simplified.

With reference to FIG. 2, description will be given by a comparison between the processes of forming the patterns of non-photosensitive and photosensitive resins. FIGS. 2(A)(a) to (g) on the left side are sectional views illustrating the process of forming the pattern of the non-photosensitive polyimide resin on a silicon wafer. FIGS. 2(B)(a) to (d) on the right side are sectional views illustrating the process of forming the pattern of the photosensitive polyimide resin on the silicon wafer.

In order to form the pattern of the non-photosensitive polyimide resin, first of all, a polyimide resin is applied onto a silicon wafer 10, thereby forming a polyimide resin film 31 ((A) (a)). Next, a resist film 32 is formed on the polyimide resin film 31 ((A)(b)). Then, a mask pattern 33 is formed on the resist film 32 ((A)(c)). Thereafter, the resist film 32 is exposed through the mask pattern 33, and is further developed, thereby forming a resist pattern 32a ((A) (d)). Subsequently, after the mask pattern 33 is removed, the polyimide resin 31 is subjected to etching by using the resist pattern 32a as a mask, thereby forming a polyimide resin pattern 31a ((A) (e)). Next, the resist pattern 32a is removed ((A) (f)). Then, the polyimide resin pattern 31a is cured, thereby forming a polyimide resin pattern 31b. Thus, the pattern forming process is completed ((A) (g)).

On the other hand, in order to form the pattern of the photosensitive polyimide resin, a photosensitive polyimide resin is first applied onto the silicon wafer 10, thereby forming a polyimide resin film 34 ((B) (a)). Then, a mask pattern 33 is formed on the polyimide resin film 34 ((B)(b)). Thereafter, the polyimide resin film 34 is exposed through the mask pattern 33, and is further developed, thereby forming a polyimide resin pattern 34a. Next, the mask pattern 33 is removed ((B)(c)). Subsequently, the polyimide resin pattern 34a is cured, thereby forming a polyimide resin pattern 34b. Thus, the pattern forming process is completed ((B) (d)).

Thus, if the photosensitive polyimide resin is used, the etching step using an etchant is not required. Therefore, the pattern forming process can be simplified.

The photosensitive polyimide resin contains a photosensitive component. For this reason, if the photosensitive polyimide resin film is cured, the photosensitive component reacts so that a thickness is made smaller than the first thickness. Therefore, the photosensitive polyimide resin film should be applied with a greater thickness than a desired thickness. For example, in the case where an organic resin film having a thickness of 2 $\mu$m is to be formed finally, it is preferable that a photosensitive polyimide resin film having a thickness of 4 $\mu$m should be formed by application.

Figure 2A:
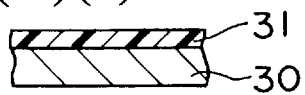
FIGS. 2(A) (*a*) to (*g*) are sectional views showing the steps of a method for patterning a non-photosensitive organic resin film, FIGS. 2(B) (*a*) to (*d*) are sectional views showing the steps of a method for patterning a photosensitive organic resin film, and FIGS. 2(B)(*e*) and (*f*) are enlarged sectional views showing a main part of a protruding portion of the organic resin film.
Figure 2A:
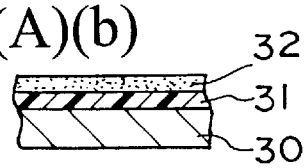
Figure 2A:
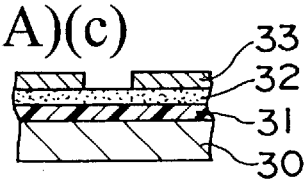
Figure 2A:
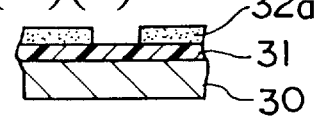
Figure 2A:
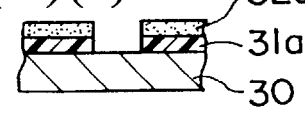
Figure 2A:
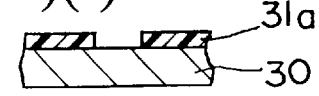
Figure 2A:
Figure 2B:
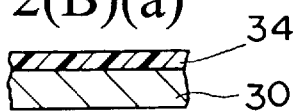
Figure 2B:
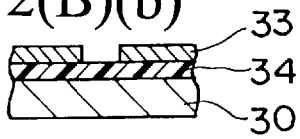
Figure 2B:
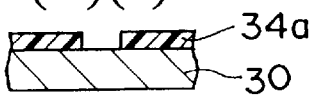
Figure 2B:
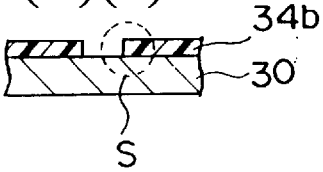
Figure 2B:
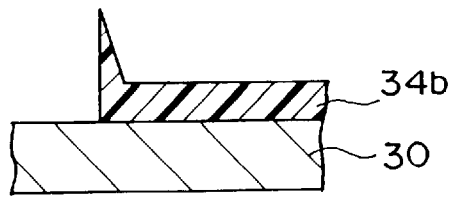
Figure 2B:
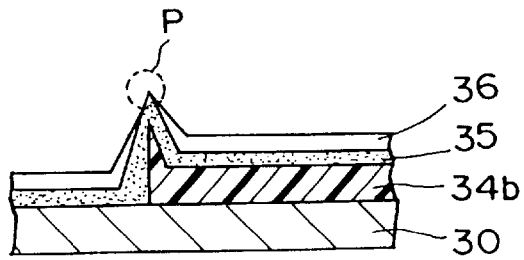

However, a reduction in the thickness obtained by the curing is less in the edge portion of the resin pattern than other portions. For this reason, a protruding portion in which the polyimide resin film is raised like a protrusion along the edge of the pattern is formed. This state is shown in FIG. 2 (B) (e). FIG. 2(B)(e) is an enlarged view illustrating a portion surrounded by a broken line circle shown by S in FIG. 2(B) (d).

As shown in FIG. 2(B)(f), when a UBM (Under Bump Metal (which is also referred to as a "common electrode film" or "an under bump metal") 35 and a plated resist 36 are provided across the protruding portion, abnormal plating is generated on the tip of the protruding portion in a part surrounded by a broken line circle shown by P in FIG. 2(B)(f). For this reason, if the protruding portion is provided, it is hard to control a plating thickness.

The cured photosensitive polyimide film (T) and the height (H) of the protruding portion based on the surface thereof were measured. As a result, if T=2.1 μm was set, H=0.2 μm was obtained, and if T=3.0 μm was set, H=0.4 μm was obtained, for example. On the other hand, for example, if T=4.0 μm was set, H=5.5 μm was obtained. Thus, if the thickness exceeds 3 μm, the protruding portion is rapidly raised. Accordingly, it is preferable that the thickness of the photosensitive polyimide film should be 3 μm or less.

Protruding Electrode

Next, description will particularly be given to the protruding electrode 12 of the structure on the IC chip 10 side.

The protruding electrode 12 is formed by an eutectic solder having a melting temperature which is lower than a heat resisting temperature (of about 260° C. at most) of the organic circuit board 14 and a heat resisting temperature (of about 400° C.) of the organic resin film 27. In the present embodiment, the eutectic solder has a composition containing tin (Sn) and lead (Pb) at a weight ratio of 60%:40%, and has a melting temperature of about 230° C . or less which is sufficiently low. Therefore, the IC chip 10 can be mounted by flip chip bonding in self-alignment without melting the organic resin film 27. As a result, the IC chip 10 can easily be mounted with a precision which allows a shift of 60 μm for a bonding pattern having a diameter of 120 μm, for example.

On the other hand, in the case where the protruding electrode is formed of a high melting point solder having a weight ratio of Sn to Pb of 95%:5% and a melting temperature of about 300° C. to 314° C., it may not be molten when the IC chip 10 is to be mounted by flip chip bonding. For this reason, the self-alignment function cannot be utilized when the IC chip 10 is to be mounted. As a result, a precision of 5 μm or less is required for the bonding pattern having a diameter of 120 μm, for example.

In order to achieve such a high alignment precision, for example, it is necessary to use a high performance bonding device capable of recognizing the positional relationship between the IC chip and the organic circuit board. Such a device is expensive. Therefore, if the self-alignment function is not utilized, the manufacturing cost of the semiconductor package is increased.

Arrangement of Protruding Electrode

Figure 3:
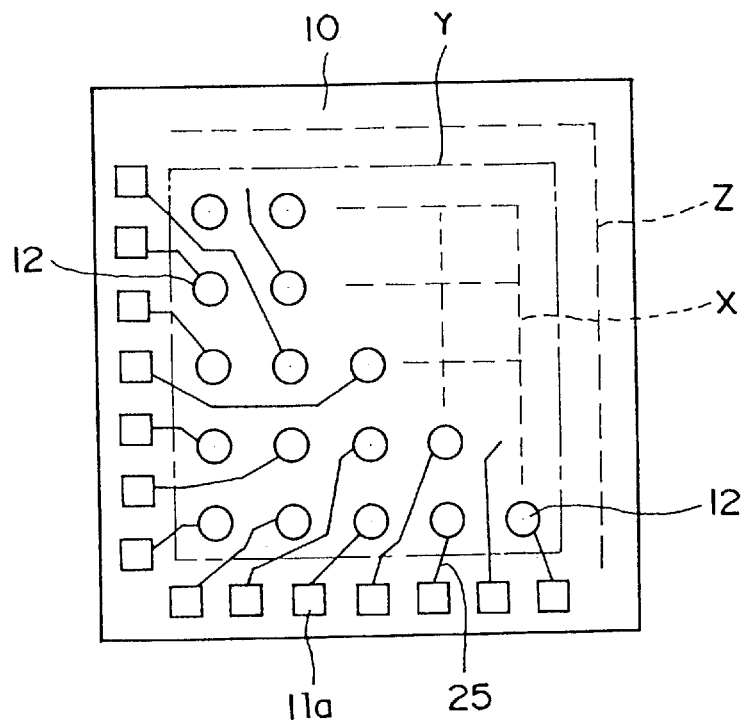
FIG. 3 is a plan view showing an IC chip according to the embodiment of the present invention.

With reference to FIG. 3, the arrangement of the protruding electrode 12 will be described below. FIG. 3 is a plan view showing the main surface side of the IC chip. In FIG. 3, an electrode pad 11a for wire bonding which is not exposed to the main surface and a rewiring structure 25 are also shown in a solid line for convenience.

In the present embodiment, an inexpensive IC chip 10 for wire bonding is utilized. However, the electrode pad for wire bonding is arranged in the peripheral form along the outer periphery of the main surface of the IC chip. In FIG. 3, the arrangement of a part of the electrode pad 11a is typically shown in a broken line Z.

In order to implement the self-alignment mounting, however, it is necessary to keep a constant space between the bonding patterns or more. For this purpose, the protruding electrodes should also be arranged on the main surface of the IC chip at a constant space or more. In order to provide more electrode pads on the main surface of the IC chip while keeping a constant space, it is preferable that the protruding electrodes 12 should not be provided in the peripheral form but in a grid array.

In the present embodiment, the protruding electrodes 12 are provided in a grid array of a region Y which is inside surrounded by the electrode pads 11a. In FIG. 3, the arrangement of a part of the protruding electrodes 12 is typically shown by a grid X in a broken line. The intersection point of the grids is equivalent to the position of each of the protruding electrodes 12.

In order to eliminate a possibility that the adjacent bonding patterns might be short-circuited during the self-alignment mounting, it is necessary to keep the pitch of the protruding electrodes 12 having a constant value or more, that is, the pitch of the bonding pattern having a constant value or more.

The minimum pitch of lines/spaces of an ordinary mass-produced board is 80 μm/ 80 μm. Accordingly, the minimum diameter of the bonding pattern is 80 μm. In order to utilize the self-alignment function, a pattern gap of 40 μm between the adjacent bonding patterns is required. Furthermore, since the minimum space is 80 μm, a minimum bonding pitch is 200 μm (=80 μm+40 μm+80 μm). Accordingly, it is preferable that the bonding pattern pitch should be 200 μm or more.

Rewiring Structure

Figure 4:
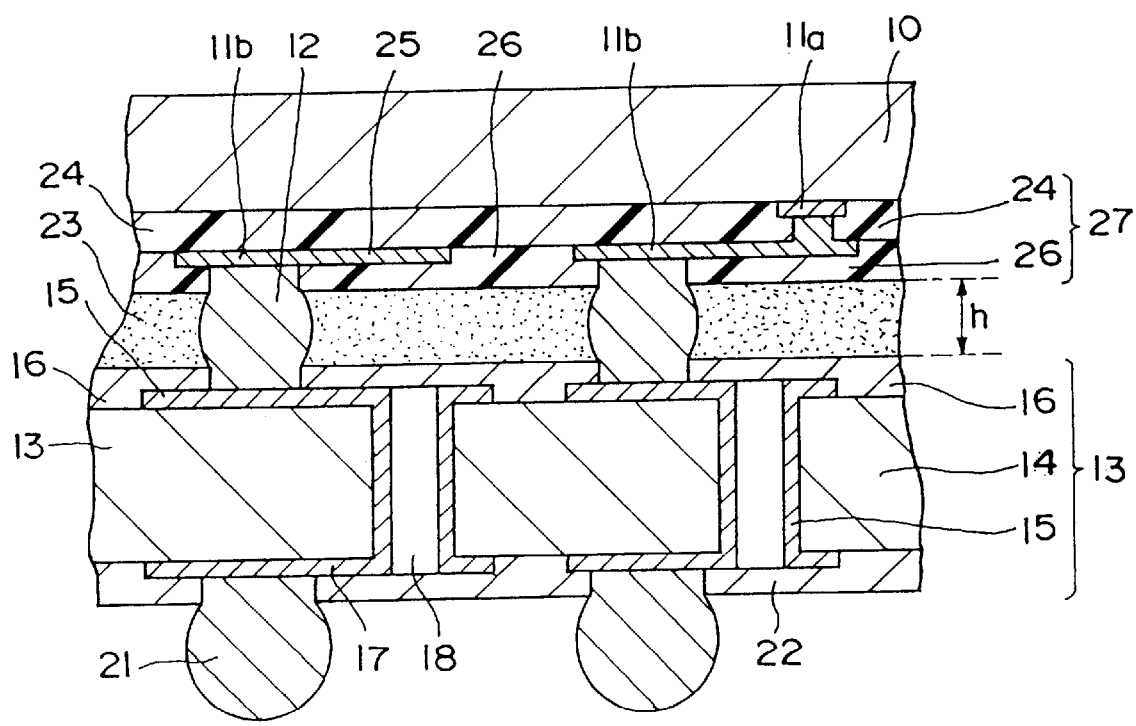
FIG. 4 is an enlarged sectional view showing a main part of the semiconductor package according to the embodiment of the present invention.

As shown in FIGS. 3 and 4, the rewiring structure 25 for electrically connecting the electrode pad 11a and the protruding electrode 12 is provided in the organic resin film 27. FIG. 4 is an enlarged sectional view showing the main part of the semiconductor package 100. In FIG. 3, the arrangement of the rewiring structure 25 is typically shown in a solid line.

If the rewiring structure 25 is thus provided, a conventional inexpensive IC chip for wire bonding can be utilized. Therefore, the protruding electrodes can be arranged in a grid array while suppressing an increase in the manufacturing cost.

Furthermore, the rewiring structure 25 is formed on a first organic resin film 24 having an opening on the electrode pad 11a for wiring bonding as shown in FIG. 4. Furthermore, the rewiring structure 25 is covered with a second organic resin film 26.

The second organic resin film 26 has openings in a grid array. The rewiring structure 25 portion exposed to the opening acts as an electrode pad 11b for flip chip bonding. In the present embodiment, an Au layer (not shown) is formed on the surface of the electrode pad 11b by electroless plating. The protruding electrode 12 is formed on the electrode pad 11b.

Figure 5:
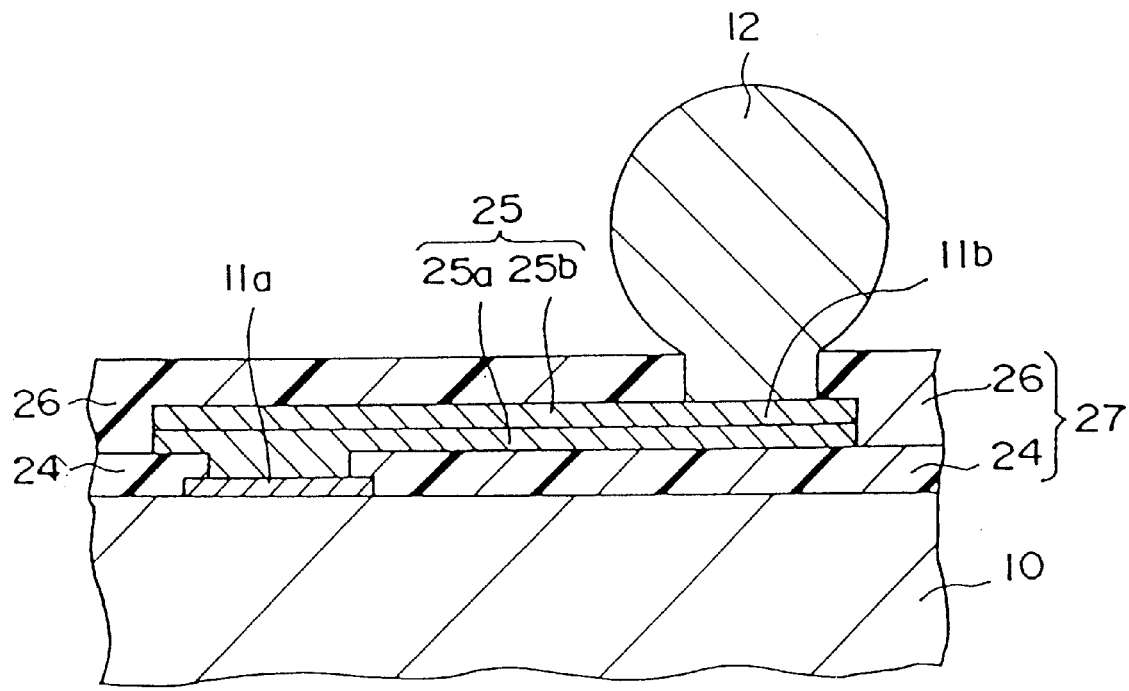
FIG. 5 is an enlarged sectional view showing a main part of the IC chip according to the embodiment of the present invention.

In the present embodiment, furthermore, the rewiring structure 25 is a two-layer structure having a chromium layer 25a and an aluminum layer 25b as shown in FIG. 5. The chromium layer 25a has high adhesion to the organic resin film 27, and the aluminum layer 25b has excellent conductivity. Accordingly, these two layers are provided, resulting in the rewiring structure 25 having excellent adhesion and high conductivity.

While the chromium layer 25a and the aluminum layer 25b are actually concaved on the opening over the electrode pad 11a for wiring bonding according to the opening, this concave portion is not shown in FIG. 5.

Structure of Protruding Electrode

Figure 6:
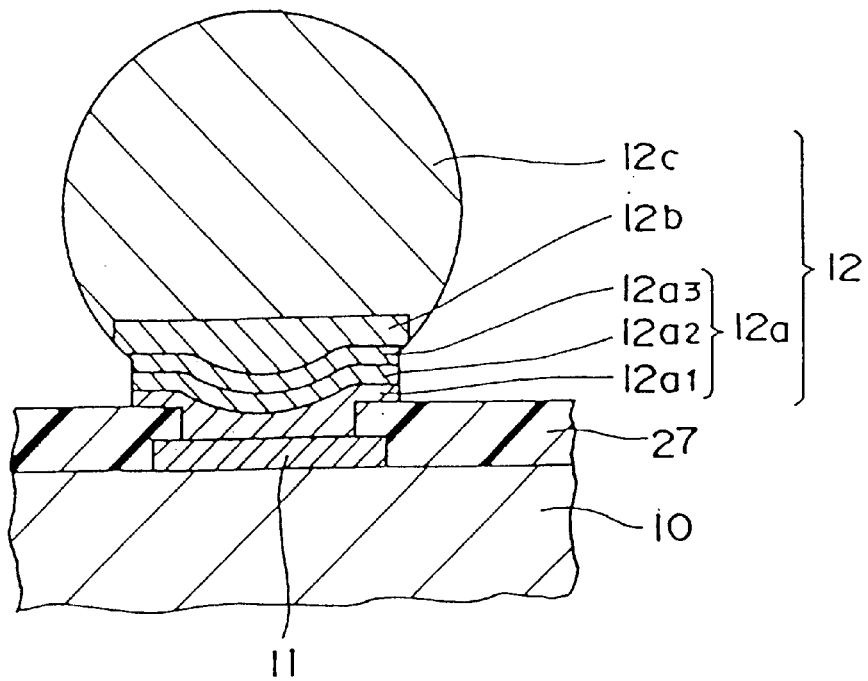
FIG. 6 is a sectional view showing a protruding electrode of the IC chip according to the embodiment of the present invention.

Next, the structure of the protruding electrode 12 will be described below with reference to FIG. 6. FIG. 6 is a sectional view illustrating the structure of the protruding electrode 12. FIG. 6 illustrates an example in which the protruding electrode 12 is formed on the electrode pad 11 corresponding to the electrode pad 11a for wire bonding shown in FIG. 4 for convenience. Moreover, the protruding electrode 12 formed on the electrode pad 11b for flip chip bonding has the same structure.

As shown in FIG. 6, the protruding electrode has a structure in which an under bump metal 12a and a core layer 12b are sequentially provided on an aluminum (Al) electrode pad 11 and a solder bump of en eutectic solder 12c is further formed on the core layer 12b.

The under bump metal 12a has a structure in which an aluminum (Al) layer 12a1, a chromium (Cr) layer 12a2 and a copper (Cu) layer 12a3 are sequentially provided by a sputtering method. The Al layer 12a1 is provided to keep the adhesion to the electrode pad 11. The Cr layer 12a2 serves to prevent the diffusion of Cu from the Cu layer 12a3 to the Al layer 12a1. Moreover, the Cu layer 12a3 has the excellent adhesion to the Cr layer 12a2, and easily gets wet with a solder. Furthermore, the Cu layer 12a3 can easily remove a natural oxide film formed on a surface.

When the eutectic solder 12c is molten to mount the IC chip 10 by utilizing the self-alignment function, Sn atoms in the eutectic solder 12c are diffused. When the Sn atoms reach the Cr layer 12a2, the adhesion of the Cr layer 12a2 is deteriorated. In the present embodiment, a core layer 12b having a thickness of about 5 μm or more is provided. Since the core layer 12 is provided, the diffusion of the Sn atoms to the Cr layer 12a2 can be suppressed.

Moreover, since the core layer 12b is provided, it is possible to keep a constant protruding electrode height or more when the IC chip is to be mounted.

If the thickness of the core layer 12b is set to about 20 μm or less, a stress applied to the Al electrode pad by the thermal expansion of the protruding electrode is excessively increased so that the separation of the electrode pad 11 from the IC chip 10 can be avoided.

Organic Circuit Board

Next, the structure on the organic circuit board 13 side will be described.

The organic circuit board 13 uses a glass epoxy resin as a base material 14, and a bonding pattern 15 for IC chip connection is formed on the first main surface side 13a as shown in FIGS. 1 and 4. The protruding electrodes 12 of the IC chip 10 are arranged in a grid array. Therefore, each bonding pattern 15 is also arranged in a grid array. The first main surface side 13a is covered with a resist film 16 having an opening on each bonding pattern 15.

Arrangement of Through Hole

Next, the arrangement of the through hole 18 in the organic circuit board 13 will be described with reference to FIG. 7.

Figure 7:
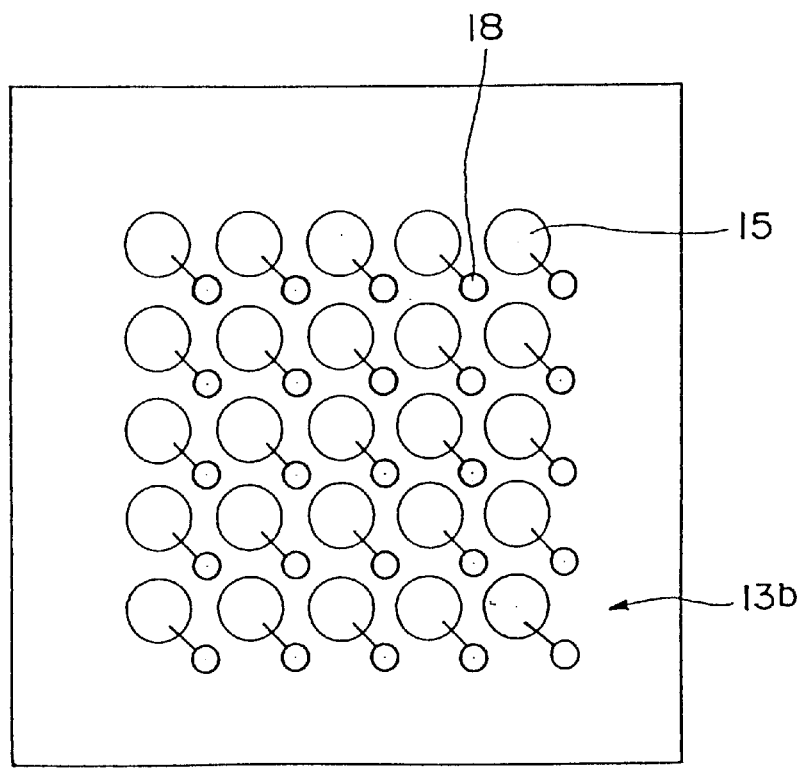
FIG. 7 is a plan view showing the first main surface side of an organic circuit board according to the embodiment of the present invention.

FIG. 7 is a plan view showing the second main surface side 13b of the organic circuit board 13. As shown in FIG. 7, an external terminal pattern 17 is formed in a grid array on the second main surface side 13b. The second main surface side 13b is covered with a resist 22 having an opening on each external terminal pattern 17. In the present embodiment, a through hole is provided in a position shifted by a half grid from the position of the grid where the external terminal pattern 17 is arranged as shown in FIG. 7.

In FIG. 7, each external terminal pattern 17 and the through hole 18 connected to the external terminal pattern 17 are connected by a straight line, respectively.

If most of through holes 18 are thus arranged between the external terminal patterns, it is not necessary to provide an ordinary wiring between other external terminal patterns. Therefore, the area of the organic circuit board can be reduced without decreasing the number of the external terminal patterns as compared with the case where the through holes are provided on the outside of a region where the external terminal patterns are to be formed. In addition, the length of a wiring path between the external terminal pattern and the bonding pattern can be reduced. Consequently, the electrical characteristics of the semiconductor package can be enhanced.

On the first main surface side 13a of the organic circuit board 13, the bonding pattern 15 for IC chip connection is provided in a position shifted from a portion positioned just above the through hole 18. If the bonding pattern 15 is thus provided excluding the portion positioned just above the through hole, the protruding electrode 12 and the bonding pattern 15 can surely be connected electrically when the IC chip 10 is to be mounted by flip chip bonding.

Resin Sealing

Next, resin sealing will be described.

The IC chip 10 is mounted by flip chip bonding on the organic circuit board 13 with face down by electrically connecting the electrode pad 11b and the bonding pattern 15 through the protruding electrode 12 as shown in FIG. 4. Furthermore, a gap between the IC chip 10 and the organic circuit board 13 is integrally sealed with a thermosetting sealing resin 23 by side potting.

In order to fill the gap between the organic circuit board 13 and the IC chip 10 with the sealing resin 23, it is preferable that the gap should have a constant height or more.

Figure 8:
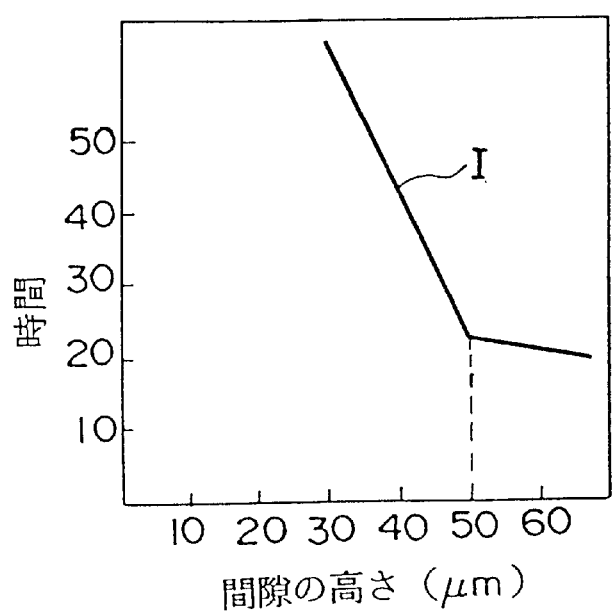
FIG. 8 is a graph showing the relationship between the height of a gap between the IC chip and the organic circuit board and a time taken to inject a sealing resin according to the embodiment of the present invention.
Figure 9:
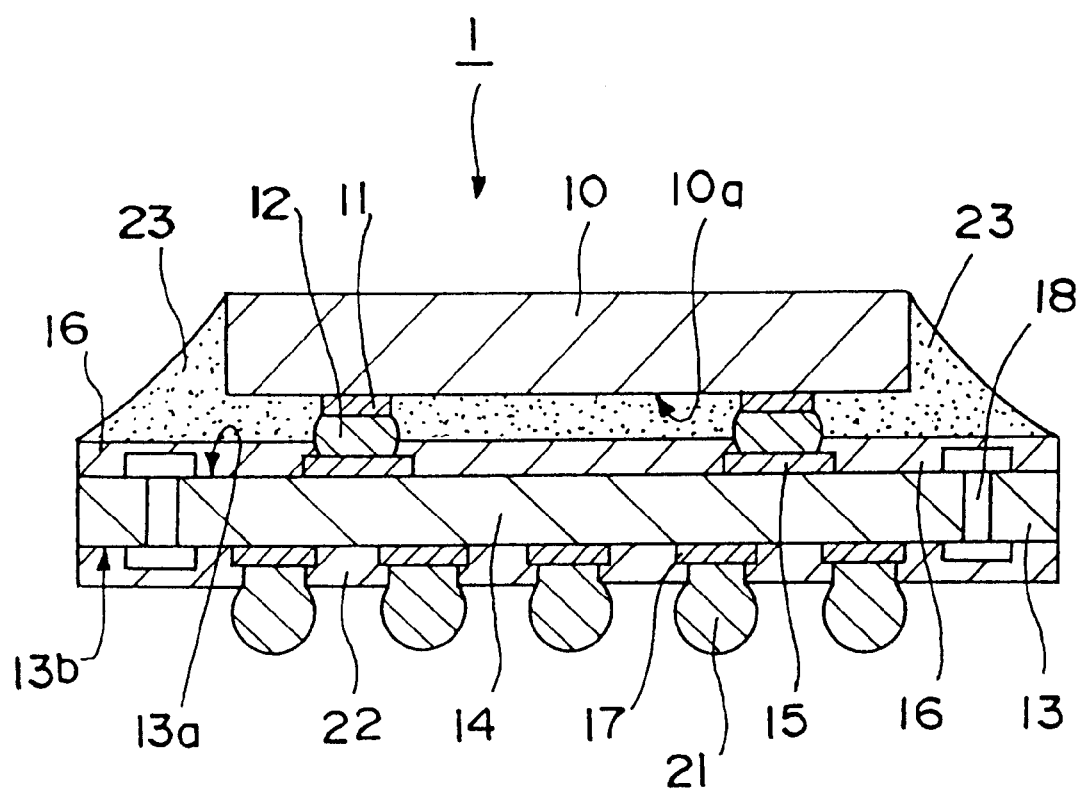
FIG. 9 is a sectional view showing a semiconductor package according to the prior art.

A graph of FIG. 8 shows the relationship between the height of the gap and a time taken for the filling. In the graph, an axis of abscissa indicates the height of the gap and an axis of ordinate indicates a time (second). A solid line I in the graph indicates the time taken for the filling of an epoxy resin having a viscosity of 90 poises at a temperature of 25° C. between the organic circuit board 13 having 6 mm square and the IC chip 10. It is apparent from the solid line I that the time taken for the filling is rapidly increased if the height of the gap exceeds 50 μm. Accordingly, it is preferable that the height of the gap should be about 50 μm or more.

In order to avoid an excessive increase in the height of the semiconductor chip 100, it is preferable that the height of the gap should be about 150 μm or less.

Blocking of Through Hole

If the through hole 18 is provided as shown in FIG. 7, most of through holes 18 are positioned just below the IC chip 10 which is mounted by flip chip bonding on the organic circuit board 13. As a result, when the sealing resin 23 is injected into the gap between the IC chip 10 and the organic circuit board 13, it also flows into a large number of through holes 18. Consequently, it becomes hard to accurately control the amount of the sealing resin 23 to be injected. If the amount of the injection is too large, the sealing resin 23 overflows into the top face of the IC chip 10 so that the thickness of the semiconductor package 100 is increased, for example. If the amount of the injection is small, the air is mixed into the sealing resin 23 via the through hole 18. Consequently, a void is easily generated.

In the present embodiment, the end of the first main surface side 13a of the through hole 18 is covered with a solder resist film 16 in the region of the organic circuit board 13 which is sealed with the sealing resin 23 as shown in FIG. 4. In the present embodiment, furthermore, the end of the second main surface side 13b of the through hole 18 is also covered with a solder resist film 22.

If the entrance of the through hole 18 in the sealing region is thus covered, the sealing resin can be prevented from flowing into the through hole. Therefore, the amount of the sealing resin to be injected can accurately be controlled. As a result, it is possible to suppress the overflow of the sealing resin and the generation of the void. Since the entrance of the through hole is simply blocked, it is not necessary to perform a step of filling the through hole with a solid.

Figure 10A:
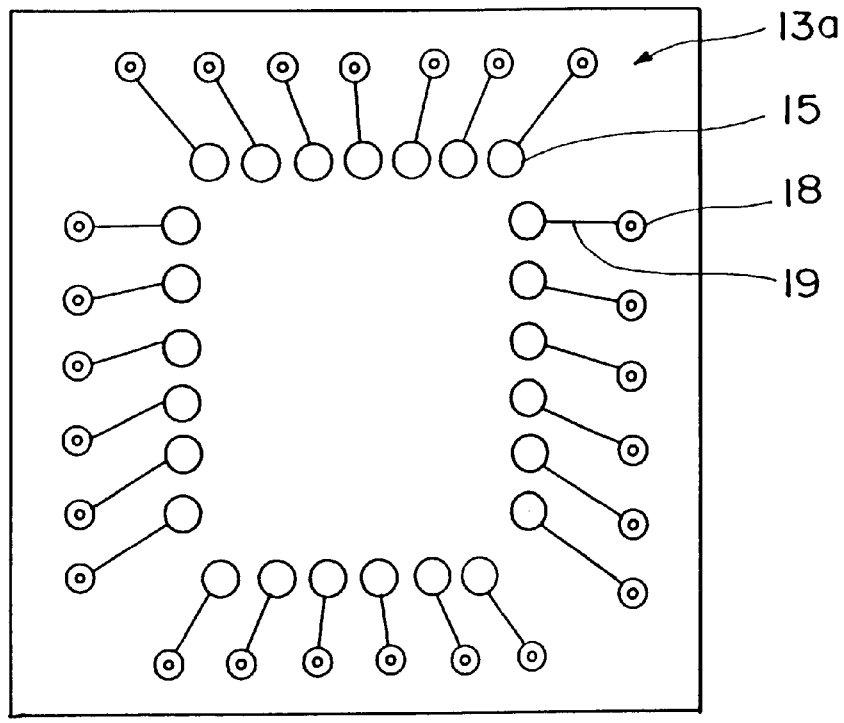
FIG. 10(A) is a plan view showing the first main surface side of an organic circuit board according to the prior art.
Figure 10B:
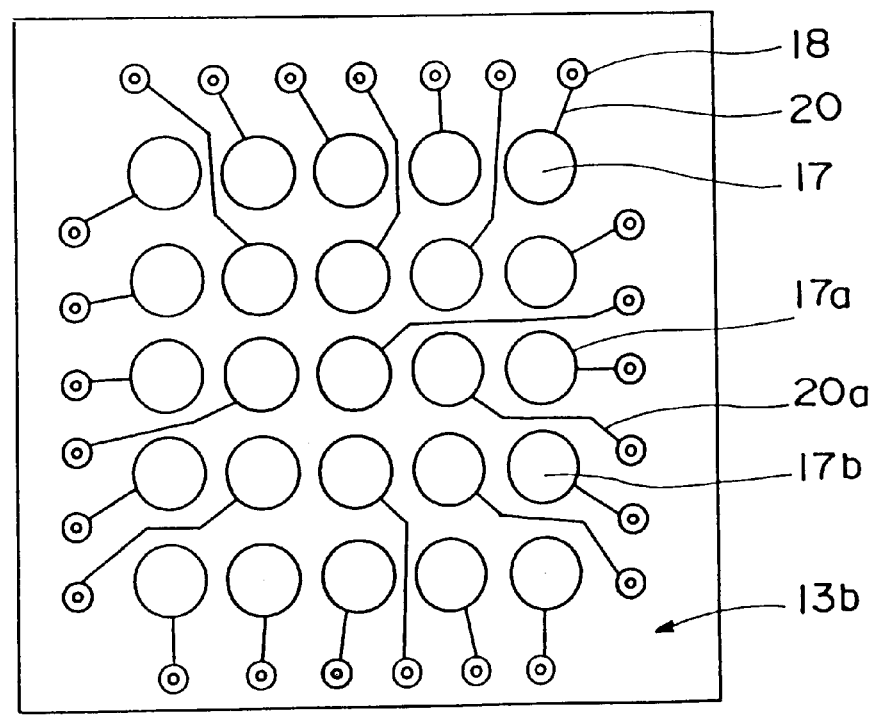
FIG. 10(B) is a plan view showing the second main surface side thereof.

In a conventional collecting circuit board, the through hole is provided in the outer peripheral portion as shown in FIG. 10. Therefore, the flow of the sealing resin into the through hole and the mixture of the air from the through hole into the sealing resin have rarely mattered. Furthermore, in the case where the IC chip is to be wire bonding mounted, the IC chip is die bonded on the organic circuit board. Therefore, it has not been necessary to inject the sealing resin between the IC chip and the organic circuit board.

Ball Electrode

Next, a ball electrode 21 formed on the organic circuit board 13 will be described.

As shown in FIGS. 1 to 4, the ball electrode 21 is formed on the external terminal pattern 17. The semiconductor package 100 is mounted on a mother board (not shown) via the ball electrode 21.

In the present embodiment, the ball electrode 21 is formed of a material having the same component as the eutectic solder constituting the protruding electrode 12. With such a structure, the ball 21 is subjected to a reflow at a lower temperature than the heat resisting temperature of the organic resin film 27. As a result, the semiconductor package can be mounted on the mother board without melting the organic resin film 27.

When the ball electrode is to be subjected to the reflow, the protruding electrode is also molten by a heat treatment. However, the protruding electrode is sealed with the sealing resin 23. Therefore, even if the protruding electrode 12 is molten, there are no problems.

While the example in which the specific material is used and the formation is carried out on the specific conditions has been described in the above-mentioned embodiment, various changes and modifications can be made in the present invention. For example, although the example in which the photosensitive polyimide resin is used for the organic resin film has been described in the above-mentioned embodiment, the organic resin film is not restricted to the photosensitivity in the present invention. Furthermore, resins other than the polyimide resin can also be used for the organic resin film.

INDUSTRIAL APPLICABILITY

As described above, the semiconductor package according to the present invention is suitable for an inexpensive semiconductor package having a small size and excellent reliability which is to be mounted on a cameral integral type VTR, a small-sized portable apparatus and the like.

What is claimed is:

1. A semiconductor package comprising an organic circuit board in which a bonding pattern for IC chip connection is formed on a first main surface side, an external terminal pattern is formed in a grid array on a second main surface side and a through hole for electrically connecting the bonding pattern and a ball electrode terminal is formed, and an IC chip which has an electrode pad formed on a main surface and is mounted by flip chip bonding on the organic circuit board through a protruding electrode formed on the electrode pad, a gap between the organic circuit board and the IC chip being filled with a sealing resin, and a ball electrode being formed on the external terminal pattern, wherein the main surface of the IC chip is covered with an organic resin film having an opening on the electrode pad, and the protruding electrode is formed of an eutectic solder having a lower melting temperature than a heat resisting temperature of the organic resin film.

2. The semiconductor package according to claim 1, wherein the organic resin film has a thickness of 1 $\mu$m to 10 $\mu$m.

3. The semiconductor package according to claim 1, wherein the organic resin film is formed essentially of a photosensitive polyimide resin.

4. The semiconductor package according to claim 3, wherein the organic resin film portion has a thickness of 1 $\mu$m to 3 $\mu$m.

5. The semiconductor package according to claim 1, wherein the eutectic solder constituting the protruding electrode has a composition containing tin and lead at a weight ratio of 6:4.

6. The semiconductor package according to claim 1, wherein the gap between the IC chip and the circuit board has a height of 50 $\mu$m to 150 $\mu$m.

7. The semiconductor package according to claim 1, wherein the protruding electrode is constituted by a copper or nickel core layer and the eutectic solder formed on the core layer.

8. The semiconductor package according to claim 7, wherein the core layer has a thickness of 5 $\mu$m to 20 $\mu$m.

9. The semiconductor package according to claim 1, wherein a pitch at which the protruding electrodes are arranged in the range from 200 $\mu$m to 2000 $\mu$m.

10. The semiconductor package according to claim 1, wherein an electrode pad for wire bonding is formed along an outer periphery of the main surface of the IC chip, the protruding electrode is arranged in a grid array in a region surrounded by the pad; and a rewiring structure is provided in the organic resin film for electrically connecting the electrode pad and the protruding electrode for mounting by flip chip bonding.

11. The semiconductor package according to claim 10, wherein the rewiring structure is a two-layer structure having a chromium layer and an aluminum layer.

12. The semiconductor package according to claim 1, wherein at least a part of the through holes formed on the organic circuit board are provided in positions shifted by a half grid from a position of a grid where the external terminal pattern is formed.

13. The semiconductor package according to claim 12, wherein an end on the first main surface side of the through hole is covered with a solder resist film in a region sealed by the sealing resin of the organic circuit board.

14. The semiconductor package according to claim 12, wherein the bonding pattern for IC chip connection is provided in a position shifted from a portion positioned just above the through hole.

15. The semiconductor package according to claim 1, wherein the ball electrode is formed of a material having the same component as an eutectic solder constituting the protruding electrode.

* * * * *